United States Patent [19]

Wright

[11] Patent Number: 4,731,595

[45] Date of Patent: Mar. 15, 1988

[54] RESONATOR STRUCTURE

[75] Inventor: Peter V. Wright, Dallas, Tex.

[73] Assignee: RF Monolithics, Inc., Dallas, Tex.

[21] Appl. No.: 822,233

[22] Filed: Jan. 24, 1986

[51] Int. Cl.$^4$ .............................................. H03H 9/15
[52] U.S. Cl. ................................. 333/195; 310/313 D
[58] Field of Search ............................... 333/193–196, 333/150–155; 313/313 R, 313 B, 313 C, 313 D

[56] References Cited

U.S. PATENT DOCUMENTS

| | | | |
|---|---|---|---|
| 3,886,504 | 5/1975 | Hartmann et al. | 333/195 |
| 4,081,769 | 3/1978 | Shreve | 333/196 X |
| 4,281,301 | 7/1981 | Stevens et al. | 333/151 X |
| 4,325,037 | 4/1982 | Bulst et al. | 333/196 X |
| 4,467,235 | 8/1984 | De Wames et al. | 310/313 B X |
| 4,507,581 | 3/1985 | Tabuchi et al. | 310/313 B |
| 4,616,197 | 10/1986 | Wright | 333/196 X |
| 4,635,009 | 1/1987 | Ebata | 333/196 X |

FOREIGN PATENT DOCUMENTS 0037724   3/1984   Japan .................... 333/195

Primary Examiner—Eugene R. LaRoche
Assistant Examiner—Seung Ham
Attorney, Agent, or Firm—Sigalos & Levine

[57] ABSTRACT

A surface acoustic wave resonator device having a resonant cavity formed on a substrate between a transducer and its related grating that causes a symmetric frequency response with one major resonant frequency response and low spurious frequency responses, with no etched grooves or recessed electrodes, with a minimum electrode geometry of $\lambda/4$, with single level fabrication and uniform wave velocity throughout the structure and being frequency insensitive to electrode reflections.

13 Claims, 16 Drawing Figures

RESONATOR STRUCTURE

BACKGROUND OF THE INVENTION

The present invention relates to a resonator and in particular to a novel resonator structure having a symmetric frequency response with one major resonant frequency response and low spurious frequency response with no etched grooves or recessed electrodes, with a minimum electrode geometry of λ/4 with single level fabrication and uniform wave velocity throughout the structure and frequency insensitivity to electrode reflections. In addition, the present invention also relates to a novel resonator filter utilizing the construction principles of the novel resonator.

Current resonator designs use synchronously placed transducers with two electrodes per wavelength to achieve insensitivity to electrode reflections. The aperiodic space between the two transducers forms a resonant cavity. The design of the structure is one of physical symmetry having first and second reflective gratings separated by spaced first and second transducers with the gratings and the transducers being identical. The transducers are typically overlap weighted to realize a cosine like transverse weighting to suppress transverse modes. All electrodes and reflectors are typically single level aluminum. Such a structure has a uniform velocity with a minimum geometry of the electrodes, and the gaps between the electrodes, being quarter wavelength. Further, no grooves or recessed electrodes are required and the synchronous placement of the transducers yields a resonator whose frequency is independent of the reflection coefficient of the electrodes per unit length of the transducers. Such a structure has the disadvantages that the transducers are not positioned for maximum coupling to the standing waves generated in the substrate and the frequency response is asymmetric with high out-of-band spurious responses. There is an especially high peak on the low frequency side of resonance which can be a serious problem. For instance, if the beam width of the resonator is increased, the insertion loss at resonance can be decreased somewhat. However, the low frequency side spurious response increases rapidly thus resulting in a lower value in the out-of-band rejection capability of the resonator. Further, the level of the low side spurious response can increase in a different impedance system than the design impedance. If the loss at the low frequency side due to the spurious response decreases significantly, the oscillator in which such resonator may be used may jump to this frequency instead of the resonant frequency. It would thus be advantageous to have a symmetric frequency response with high out-of-band rejection. This would eliminate the frequency hop problem. Further, such a resonator could be used as an improved element of a coupled resonator filter.

Such a desired novel resonator structure providing the desired symmetric frequency response would require that the structure have no etched grooves or recessed electrodes, the minimum electrode geometry be λ/4 (no split finger electrodes), the structure have single level fabrication, the velocity of the wave form be uniform throughout the structure and the frequency be insensitive to electrode reflections.

The present invention overcomes the problems of the prior art resonators by utilizing a structure which has no etched grooves or recessed electrodes, has minimum electrode geometry of λ/4, has single level fabrication, has uniform wave form velocity throughout the structure and is insensitive to electrode reflections. This is accomplished on a standard or conventional crystal cut orientation by removing the resonant cavity that normally exists between the two transducers and placing that resonant cavity between one of the transducers and its associated grating. As the frequency decreases, the resonant cavity associated with the nearest transducer causes a shift in the standing waves under the nearest transducer electrode towards the space between the electrodes thus decreasing the coupling between the electrodes and the standing waves and causing a null. In like manner, as the frequency increases, the other transducer and its associated grating also shifts its standing waves toward the spaces between the electrodes thus causing a null on the high side of the frequency response. Such is the operation of the novel transducer when it is placed on a normal or standard crystal cut.

If the novel structure is placed on a natural single phase unidirectional transducer (NSPUDT) cut, that is, a crystal cut as explained in copending application Ser. No. 677,513 entitled Single Phase Unidirectional Surface Acoustic Wave Transducer and filed Dec. 3, 1984 and incorporated herein by reference and in which it was disclosed how to determine a crystal orientation such that there is a λ/8 or 45° separation between the centers of transduction and reflection, then at resonant frequency the standing waves are maximal under each electrode of both transducers and thus the output of the resonator is a maximum. However, as the frequency shifts either to the high or the low side, the standing waves move away from the centers of the electrodes toward the spaces on either side therefore causing a null to appear whether the frequency is increased or decreased. The output of this resonator structure is therefore symmetrical. However, because one of the transducers is close to the resonant cavity and the other one is further removed from the resonant cavity, there is a difference in coupling to the cavity. Therefore, if the number of electrodes in the near transducer are reduced and the number of electrodes in the far transducer are increased, the resonator output can be maximized.

In addition, by using the novel resonator structure in a resonator filter, an improved resonator filter can be obtained by placing the novel structure on a crystal having a conventional or standard orientation crystal cut and can be further improved by placing the novel resonator structure in a resonator filter formed on an NSPUDT crystal cut to obtain an improved resonator filter.

Thus, it is an object of the present invention to provide a novel resonator structure which has a symmetrical frequency response and one major resonant frequency response and low spurious frequency responses and which has no etched grooves or recessed electrodes, a minimum electrode geometry of λ/4 (without split finger electrodes) single level fabrication and a uniform wave velocity throughout the structure and frequency insensitivity to electrode reflections.

It is a further object of the present invention to provide a novel resonator in which the resonant cavity is formed between one of said transducers and its associated reflective grating structure.

It is still another object of the present invention to provide a novel resonator structure in which the resonant cavity is formed between one of said transducers and its associated reflective grating structure and the entire structure is formed on a crystal cut of normal crystal orientation.

It is yet another object of the present invention to provide a novel resonator in which the resonant cavity is formed between the input transducer and its associated reflective grating structure and the entire transducer structure is formed on a natural SPUDT crystal cut.

It is another object of the present invention to minimize the insertion loss of the novel resonator by decreasing the number of electrodes in the transducer nearest the resonant cavity and increasing the number of electrodes in the transducer furtherest from the resonant cavity thereby balancing the coupling between the transducers and the resonant cavity and maximizing the output of the resonator.

It is also an object of the present invention to utilize the novel resonator structure to form a resonator filter on both a normal crystal cut and on a natural SPUDT crystal cut.

SUMMARY OF THE INVENTION

Thus, the present invention relates to a resonator structure comprising a piezoelectric substrate, first and second spaced gratings of $\lambda/4$ electrodes attached to said substrate, input and output spaced transducer structures having $\lambda/4$ electrodes and attached to said substrate between said first and second gratings for generating standing waves in said substrate, and a resonant cavity formed on said substrate between one of said gratings and one of said transducers.

The invention also relates to a method of forming a resonator structure comprising the steps of attaching first and second spaced gratings of $\lambda/4$ electrodes to a piezoelectric substrate, attaching input and output spaced transducer structures having $\lambda/4$ electrodes to said substrate between said first and second gratings for generating standing waves in said substrate, and forming a resonant cavity on said substrate between one of said gratings and one of said transducers.

The invention also relates to a resonator filter structure comprising a piezoelectric substrate, first and second spaced gratings of $\lambda/4$ electrodes attached to said substrate, input and output spaced transducers having $\lambda/4$ electrodes and attached to said substrate between said first and second gratings for generating standing waves in said substrate, a coupler grating positioned on said substrate between said input and output transducers, a first resonant cavity formed on said substrate between said input transducer and said first grating, and a second resonant cavity formed on said substrate between said coupler grating and said output transducer.

BRIEF DESCRIPTION OF THE DRAWINGS

These and other objects of the present invention will be disclosed in conjunction with the detailed description of the attached drawings in which.

DETAILED DESCRIPTION OF THE DRAWINGS

Figure 1:
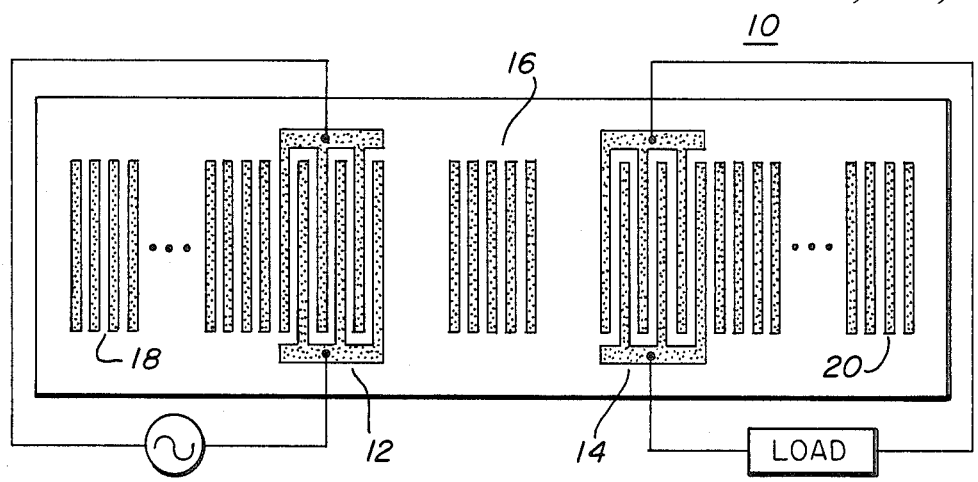
FIG. 1 illustrates the structure of a typical prior art resonator.

FIG. 1 illustrates the structure of the typical prior art resonator 10 having synchronously placed transducers 12 and 14 with each of the transducers 12 and 14 having two electrodes per wavelength and thus an electrode width of $\lambda/4$. The transducers 12 and 14 are separated by a resonant cavity 16 which is aperiodic with the transducers 12 and 14 and with reflective gratings 18 and 20. The design is physically symmetric with the gratings 18 and 20 and the transducers 12 and 14 being identical. The transducers 12 and 14 may be typically overlap weighted to realize a cosine like transverse weighting to suppress transverse modes. All of the electrodes in the transducers 12 and 14 and the gratings 18 and 20 are formed of single level aluminum. This structure is advantageous in that the velocity of the transmitted standing wave is uniform throughout the structure, the minimum geometry of the electrodes and spacings is $\lambda/4$, no grooves or recessed electrodes are required and the synchronous placement of the transducers yields a resonator whose frequency is independent of the reflection coefficient of the electrodes per unit length of the transducers. The disadvantages of this prior art resonator design are that the transducers are not positioned for maximum coupling to the generated standing waves, and the frequency response is asymmetric with high out of bound spurs.

Figure 2:
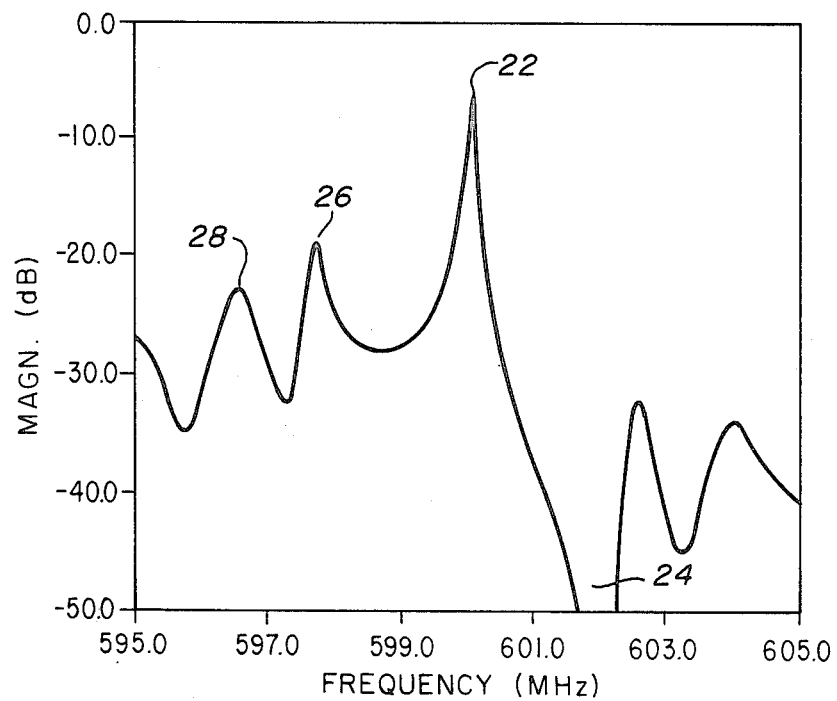
FIG. 2 illustrates the typical frequency of the prior art resonator shown in FIG. 1.

The typical frequency response of the prior art resonator shown in FIG. 1 is illustrated in FIG. 2. It will be noted that the nominal center frequency of the resonator may be as shown, for example only, 600 MHz. It also will be noted that the frequency response is a maximum at the resonant frequency as shown by the numeral 22. Note also the null 24 as the frequency increases and the spurious responses 26 and 28 as the frequency decreases. It will be noted that the spurious response 26 is approximately only 13 dB below the main peak 22.

Further, the spurious response 26 can be a serious problem. For instance, if the beam width of the resonator is increased to decrease the insertion loss at resonant frequency (600 MHz in the example illustrated in FIG. 2), the spurious response 26 increases in amplitude faster thus resulting in a lower value in the out-of-band rejection of the resonator.

Even more serious is the fact that the level of spurious response 26 can increase in a high impedance system. The resonator response shown in FIG. 2 is in a 50 ohm system. The actual source and load impedances in an oscillator circuit may be considerably higher. If as a result of the impedance levels the loss of the spurious response 26 decreases significantly the oscillator may "jump" to this frequency instead of the center frequency.

It would thus be advantageous to have a symmetric frequency response with high out-of-band rejection. Such a device would eliminate the frequency "hop" problem and such a resonator could be used as an element of a coupled resonator filter. Again, such an improved resonator structure for achieving a symmetric frequency response requires that the structure have no etched grooves or recessed electrodes, a minimum electrode geometry of $\lambda/4$ (no split finger electrodes) single level fabrication, and uniform velocity throughout the structure.

Figure 3:
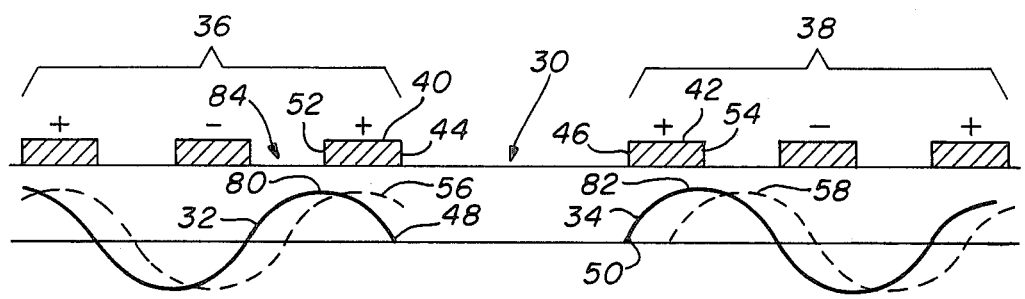
FIG. 3 is a diagrammatic illustration of the standing waves under the electrodes of the transducer at resonance.

Consider the diagrammatic illustration of the interaction of the standing waves in the substrate under the electrodes at resonance as shown in FIG. 3. The energy developed by resonant cavity 30 generates standing waves 32 and 34 under the electrodes of transducers 36 and 38. The reflection coefficient for an acoustic wave incident on stripes 40 and 42 at the front edge 44 and 46 respectively, for aluminum stripes on a quartz substrate, is less than zero when the circuit is analyzed. Thus, the front or leading edges 44 and 46 of the aluminum stripes in an array on an ST cut crystal are low impedance points. Hence, the voltages in such a reflective array will be low at the front edges of the stripes. This can be seen in FIG. 3 at points 48 and 50 of wave forms 32 and 34. Thus, at the leading edge of each of the electrodes in transducers 36 and 38 the standing waves 32 and 34 are at zero level.

Conversely, at the back edges of the reflecting stripes as illustrated at 52 and 54, the reflection coefficient is found to be greater than zero upon an analysis of the structure. Thus, the back or trailing edges of the stripes such as at 52 and 54 will behave as high impedance points. The voltages at the back edges 52 and 54 of the stripes will be a maximum, either positive or negative as shown at 80 and 82 in FIG. 3.

If the electrode structures 36 and 38 shown in FIG. 3 are placed on a natural SPUDT cut, as disclosed in copending application Ser. No. 677,513 entitled Single Phase Unidirectional Surface Acoustic Wave Transducer and filed Dec. 3, 1984, it will be seen in FIG. 3 that the voltage of standing wave 56 is a maximum directly under each electrode of transducer 36 and thus the standing waves 56 are maximally coupled to each of the electrodes of transducer 36. However, resonant cavity 30 causes a 90° phase shift in the standing wave under the electrodes of transducer 38. Thus, as can be seen in FIG. 3, the voltage of standing waves 58 are a maximum directly under the spaces between electrodes of the transducer 38 thus having a minimum coupling.

Figure 4:
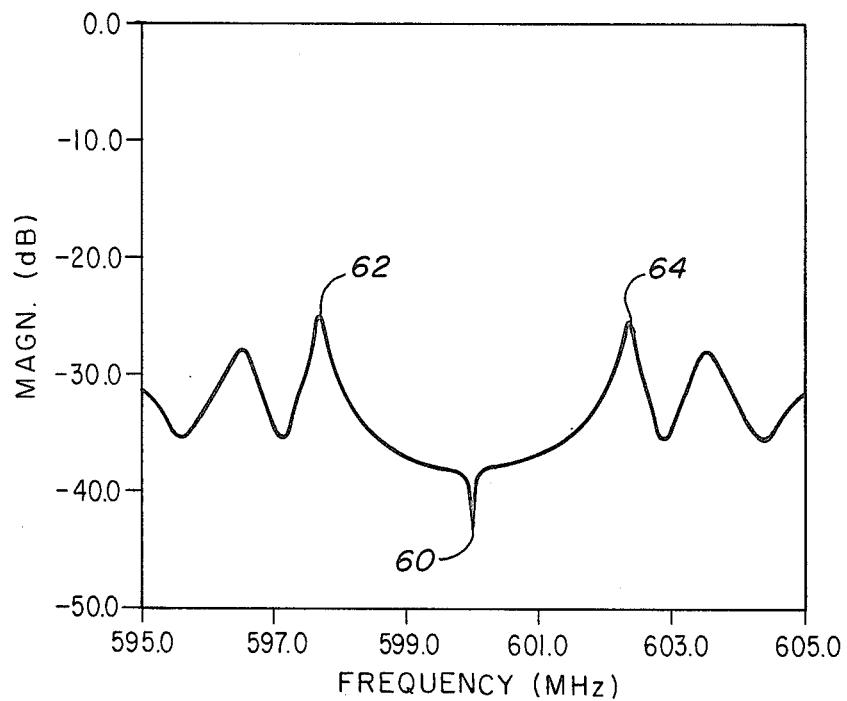
FIG. 4 illustrates the resulting frequency response of the typical prior art resonator structure on a natural SPUDT cut substrate.

Therefore, FIG. 4 illustrates the resulting frequency response if the typical prior art resonator structure is formed on a natural SPUDT cut substrate. As can be seen in FIG. 4, a null 60 occurs at resonant frequency. This can be easily understood with respect to FIG. 3 because a maximum coupling occurs with transducer 36 when a minimum or zero coupling occurs with transducer 38. The resulting output is the effect of multiplying the coupling of transducer 36 times the coupling of transducer 38. Since the coupling of transducer 38 is at a minimum the output of the transducer is at a minimum as shown at 60 in FIG. 4. If the frequency is decreased, the standing waves 56 and 58 under the transducers 36 and 38 move inwards towards the resonant cavity 30. Thus, transducer 36 begins to conduct less but transducer 38 begins to conduct more and thus a maximum peak at 62 is obtained as the frequency decreases. If the frequency increases, the standing wave patterns 56 and 58 move out away from the cavity 30. Again, transducer 36 begins to transduce less while transducer 38 begins to transduce more and again a maximum peak 64 is obtained as shown in FIG. 4. Because the same coupling in each transducer 36 and 38 occurs whether the frequency increases or decreases, the symmetrical wave form is obtained as shown in FIG. 4. Obviously, however, this is not the response which is desired since the insertion loss is a maximum at resonance.

Figure 5:
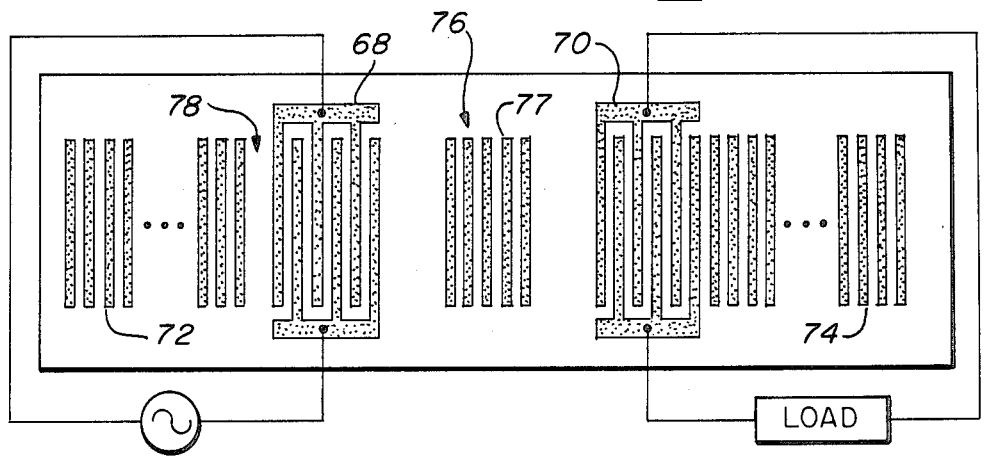
FIG. 5 illustrates the structure of the novel resonator of the present invention.

The problems associated with the prior art resonator transducer is obviated by the novel structure of the present invention as shown in FIG. 5. The novel resonator structure 66 in FIG. 5 includes reflective gratings 72 and 74 separated by first and second transducer structures 68 and 70. A space 76, which is periodic, is formed between transducers 68 and 70 and may include dummy electrodes 77 to preserve velocity in the structure between the transducers 68 and 70. A cavity 78 which is resonant with the transducer structures 68 and 70 and reflective grating structures 72 and 74 is formed between reflective grating structure 72 and transducer 68.

To understand the operation of the resonator shown in FIG. 5 when it is placed on a crystal having a natural SPUDT cut, it is necessary to recall the explanation for natural SPUDT devices set forth in commonly assigned copending application Ser. No. 677,513 entitled Single Phase Unidirectional Surface Acoustic Wave Transducer and filed Dec. 3, 1984. In that work, it was shown that the phase shift between the centers of transduction and reflection in a transducer can vary depending upon the metalization and the crystal cut. For symmetric cuts and propagation directions the transduction centers must be centered on the electrodes or the spaces between the electrodes. Looking again at FIG. 3, if the transduction centers are under the electrodes, the standing waves 32 and 34 must move in by $\lambda/8$ from that position shown for maximum coupling. If the transduction centers are centered on the spaces in FIG. 3, the standing wave patterns 32 and 34 must move outwardly from the cavity 30 by $\lambda/8$ for maximum coupling provided that the sign of the electrode reflection coefficients does not change.

On a natural SPUDT cut orientation, there is a $\lambda/8$ or 45° natural separation between the centers of transduction and reflection. Thus, the standing waves 32 and 34 in FIG. 3 will be shifted to the right or left depending on the orientation on the crystal by λ/8 or 45°. In such case, it can be seen in FIG. 3 that with the standard resonator structure the resulting shift in the standing waves 32 and 34 will result in one of the transducers being maximally coupled at synchronism while the other will be totally decoupled. The total decoupling of one of the resonators is the reason that the curve in FIG. 4 was obtained with a maximum decoupling at resonant frequency.

For the ideal resonator, both transducers should be maximally coupled at resonance. This can be achieved on an NSPUDT orientation by placing both transducers on the same side of the resonant cavity 78 as shown in FIG. 5 rather than on opposite sides as in the prior art structures as shown in FIG. 1 or FIG. 3. If both transducers 68 and 70 are placed on the right-hand side of the resonant cavity 78 as shown in FIG. 5 and the resonator 66 appropriately oriented on an NSPUDT cut to shift the standing wave 34 under the electrodes of transducer 38 toward the left by λ/8 from that shown in FIG. 3, then transducer 70 in FIG. 5 will be maximally coupled at resonance. Note in FIG. 3 that if standing wave 34 in transducer 38 in FIG. 3 is shifted to the left λ/8, then the peak 82 will be under electrode 42. However, if wave form 32 is shifted to the left λ/8 under the electrodes of transducer 36, then peak 80 will be under space or gap 84. This condition may be corrected by placing cavity 78 on the left of transducer 36 as shown in FIG. 5 instead of in the center as shown by resonant cavity 30 in FIG. 3. Wave form 32 is then shifted 90° to the right which would take the peak 80 from the center of space 84 to the center of electrode 40. Now both wave forms 32 and 34 are maximally coupled to the electrodes of transducers 36 and 38 utilizing the structure 66 shown in FIG. 5 on a natural SPUDT orientation.

As explained in copending application Ser. No. 677,513, set forth herein earlier, to construct such a structure, a theoretical analysis is made of a given crystalline material with a given metal placed thereon to find the crystalline orientation as defined by well known Euler angles such that a shift of λ/8 in the centers of reflection in the direction of wave propagation occurs with respect to the centers of transduction. The crystalline material is then cut according to the predetermined Euler angles. Finally, the electrode structure, in this case the one shown in FIG. 5, is attached to the crystalline substrate in the desired wave propagation direction which will have the centers of transduction under the electrode centers and the centers of reflection shifted λ/8 to the edge of the electrode.

Figure 6:
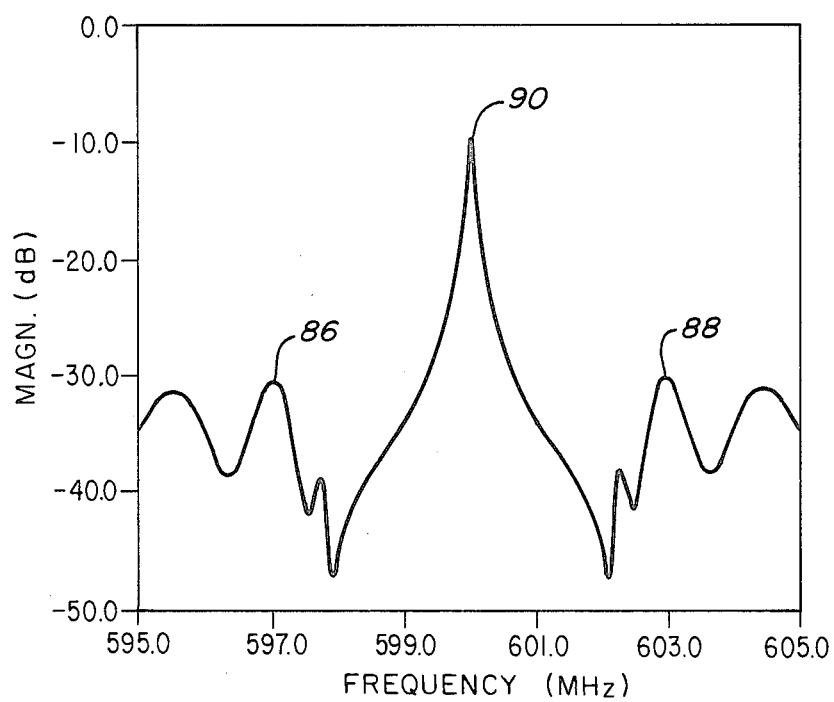
FIG. 6 is a representation of the resulting frequency response of the novel resonator structure formed on a natural SPUDT cut substrate.

The frequency response of this structure in FIG. 5 on a natural SPUDT cut orientation is shown in FIG. 6. Note that the response in FIG. 6 is totally symmetric. The side lobes 86 and 88 are all below 30 dB insertion loss, an improvement over 10 dB in rejection compared with the typical prior art design response as shown in FIG. 2. The response is symmetric because both transducers are maximally coupled at synchronism or resonance rather than blow synchronism as in the prior art standard design. In addition, the input conductance of both transducers on an NSPUDT crystal is totally symmetric about the synchronous frequency. The symmetry of the conductance on an NSPUDT crystal orientation is in sharp contrast to the asymmetric conductance of the transducers on a symmetric crystal orientation as well known in the art. Note in FIG. 6 the maximum coupling or minimum insertion loss at peak 90.

A disadvantage of the NSPUDT type resonator shown in FIG. 5 is that it is not physically symmetrical. The two transducers must still be spaced a sufficient distance apart to keep down electrical feed through. Since both transducers 68 and 70 are now on the same side of the cavity 78, one of the transducers 68 is therefore much more strongly coupled to the resonant cavity 78 than the other transducer 70. The performance may therefore be improved by decreasing the number of electrodes in transducer 68 which is closest to the resonant cavity 78 and increasing the number of electrodes in transducer 70 which is the furtherest from resonant cavity 78. This has the effect of equalizing, to some degree, the coupling of each of the transducers 68 and 70 to the resonant cavity 78. The insertion loss may be further reduced by increasing the beam width. There is no need to worry about the spurious mode rejection degradation as in the typical resonator design since the transducers 68 and 70 are both maximally coupled at resonance.

Figure 7:
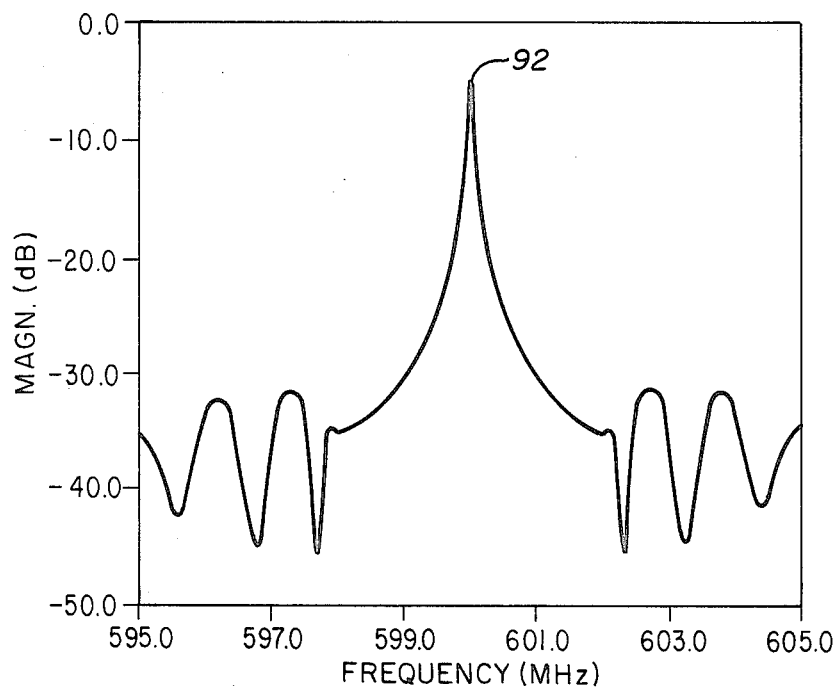
FIG. 7 illustrates the resulting frequency response of the novel resonator structure on a natural SPUDT cut substrate which resonator structure has been optimized.

The insertion loss of a more optimized NSPUDT resonator is shown in FIG. 7 when the number of electrodes in the transducer 68 closest to the resonant cavity 78 are decreased and the number of electrodes in the transducer 70 furtherest from the resonant cavity 78 are increased. Thus, as can be seen in FIG. 7 the insertion loss is actually less than that for the currently designed prior art resonator. To obtain the decreased insertion loss, the beam width was increased from 140 wavelengths to 200 wavelengths. Again it will be noted in FIG. 7 that the frequency response is entirely symmetrical with the maximum peak 92 occurring at resonance.

Figure 8:
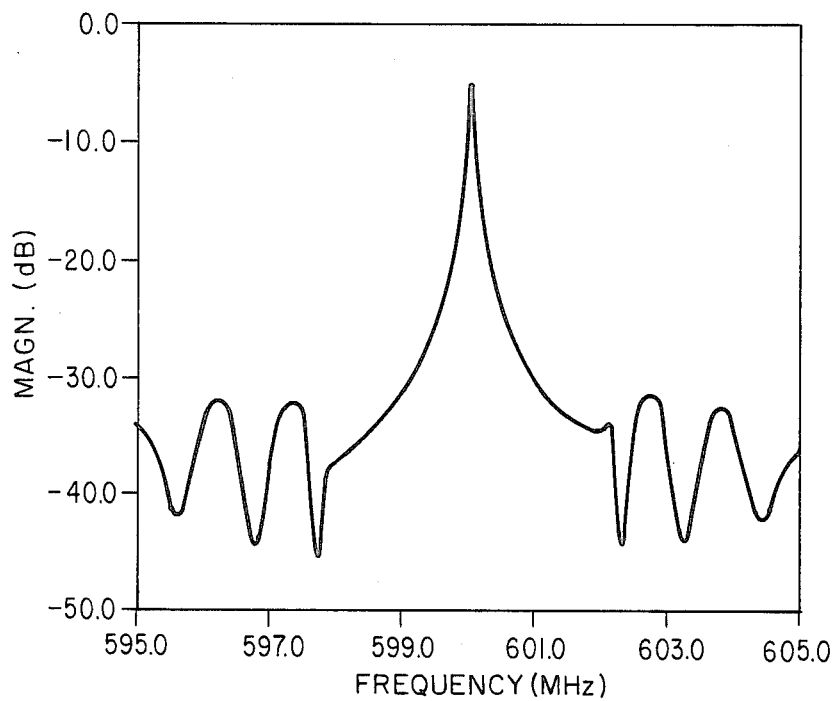
FIG. 8 is the resulting frequency response of the novel resonator structure on a natural SPUDT cut substrate in which the phase angle between the centers of transduction and reflection is shifted 40° instead of 45°.
Figure 9:
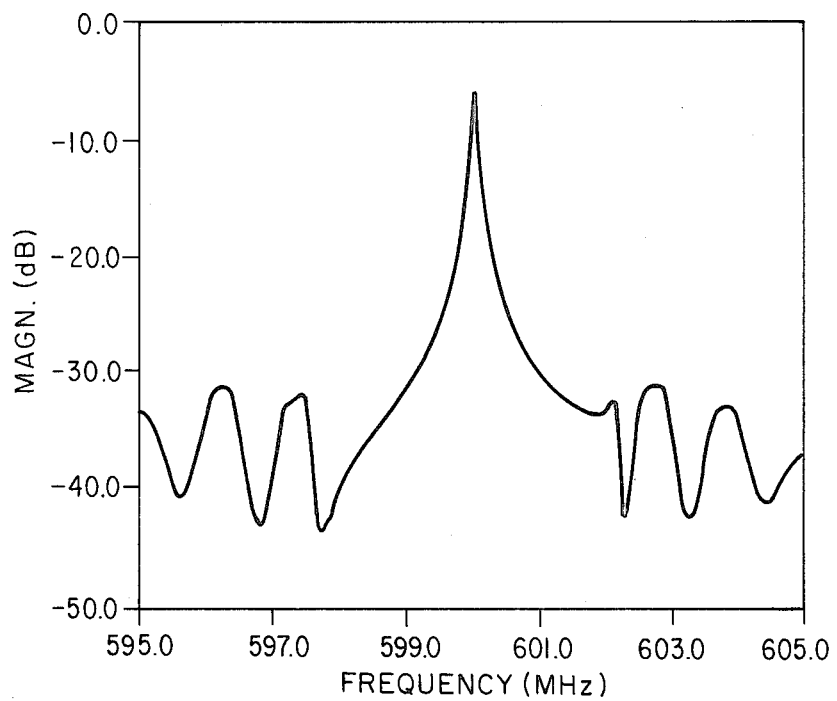
FIG. 9 is the resulting frequency response of the novel resonator structure on a natural SPUDT cut substrate in which the phase angle between the centers of transduction and reflection is 35° instead of 45°.

One question of importance is how the novel new resonator configuration would behave if the phase between transduction and reflection is not exactly 45° or λ/8. FIGS. 8 and 9 show the sensitivity of the response to the phase angle between transduction and reflection at both 35° and 40° respectively. Thus, FIGS. 8 and 9 reveal that the proposed resonator configuration is not strongly dependent on the phase angle between transduction and reflection. There is little degradation in performance of the resonator on a natural crystal cut orientation where the phase angle between transduction and reflection is 35° as shown in FIG. 9 and, of course, even less degradation at 40° as shown in FIG. 8.

Figure 10:
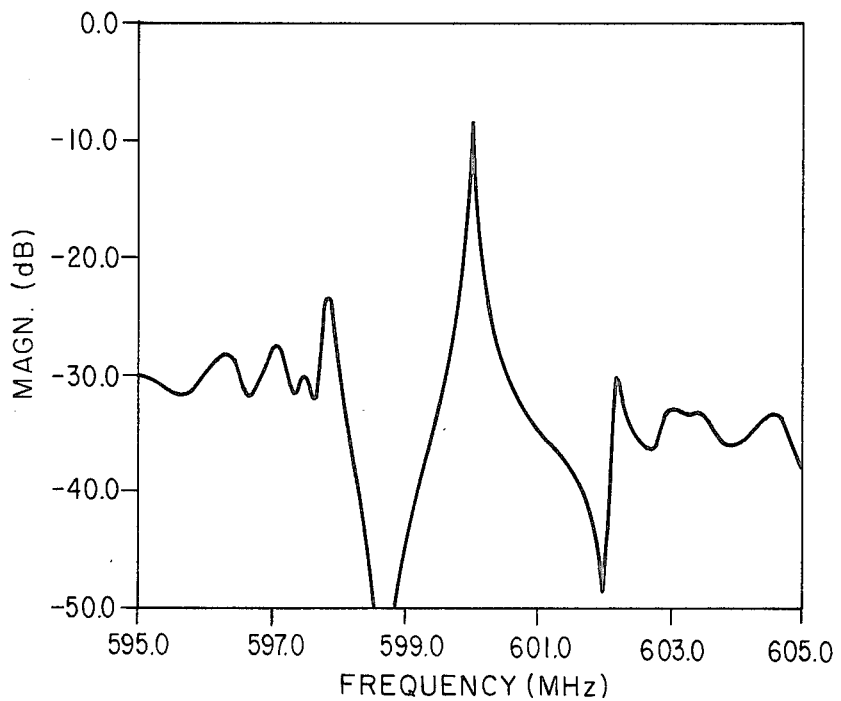
FIG. 10 represents the resulting frequency response of the novel resonator structure on a typical prior art crystal cut.

FIG. 10 shows that the new resonator configuration of FIG. 5 continues to give fairly acceptable behavior on a typical symmetric crystal orientation rather than the natural SPUDT orientation. As the frequency decreases, the resonant cavity 78 associated with the nearest transducer 68 causes a shift in the standing waves under the nearest transducer electrodes towards the spaces between the electrodes thus decreasing the coupling between the electrodes and the standing waves and causing a null. In like manner, as the frequency increases, the other transducer 70 and its associated grating 74 also shifts its standing waves toward the spaces between the electrodes thus causing a null on the high side of the frequency response. Such is the operation of the novel transducer when it is placed on a normal or standard crystal cut. In some respects the performance as shown in FIG. 10 is actually preferable to the prior art design because the resonant peak is higher with nulls on both the low and high sides. The insertion loss, however, is somewhat higher. The input impedances of such resonator will cause a response that is not symmetric as in FIG. 7 though in some applications this may not necessarily be a disadvantage.

Figure 11:
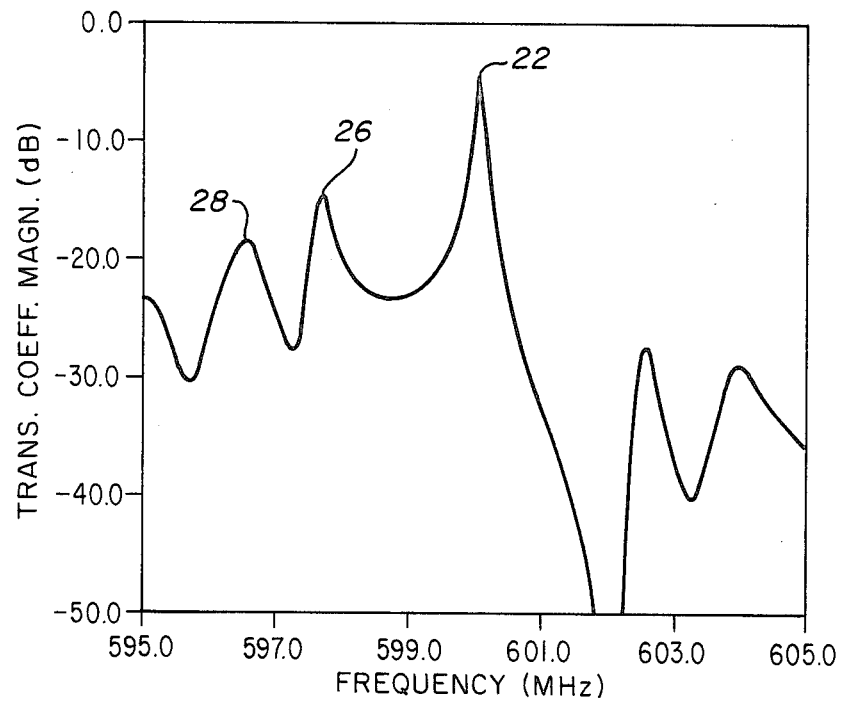
FIG. 11 is the resulting frequency response of the typical prior art resonator on a typical crystal cut and having an external loading of 150 ohms impedance.

Another advantage of the NSPUDT resonator or other resonator with a symmetrical frequency response is the decreased sensitivity to external loading. The response of the typical prior art resonator in a 150 ohm impedance system is shown in FIG. 11. Compared with FIG. 2 which is in a 50 ohm system, it can be seen that the insertion loss at resonance, represented by peak 22, has decreased. However, the low side frequency spurious response represented by peaks 26 and 28 has increased significantly which may cause problems in an oscillator circuit. The insertion loss at peak 26 of the frequency spurious response on the low frequency side is about 14.5 dB.

Figure 12:
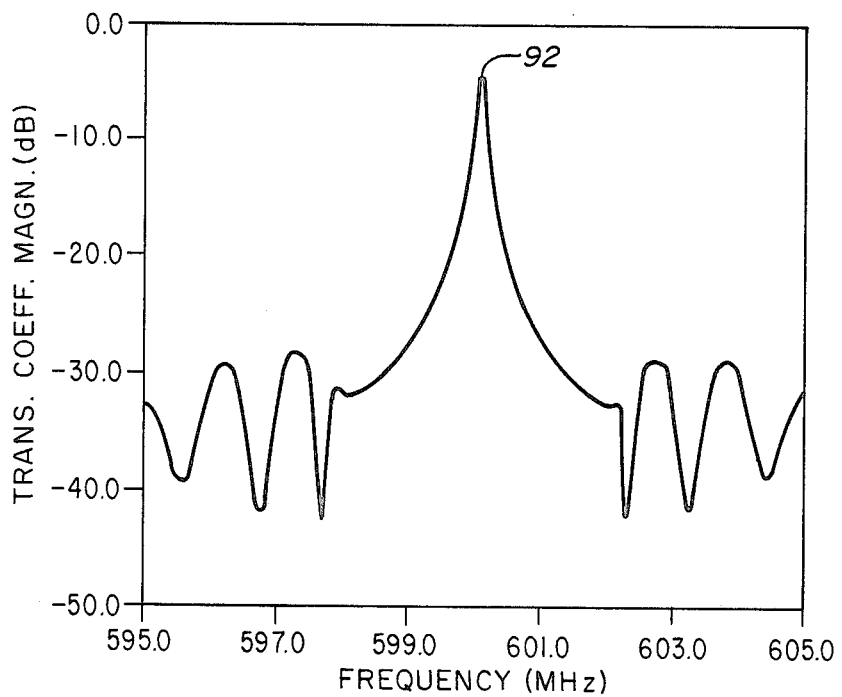
FIG. 12 is the representation of the resulting frequency response of the novel resonator structure on a natural SPUDT cut substrate with an external loading of 150 ohms impedance.

In contrast, the novel symmetric resonator of the present invention is perfectly well behaved in the high impedance system. The response of the NSPUDT resonator illustrated in FIG. 7 in a 50 ohm system is shown again in FIG. 12 in a 150 ohm system. The side lobe rejection has decreased from the response in the 50 ohm system but the insertion loss of the side lobes from the resonant peak 92 still remains below 10 dB.

FIG. 1 with a resonant cavity between coupler grating 16 and transducer 14, illustrates the structure of a typical prior art resonator filter utilizing typical resonator structures. Their operation is generally disclosed in copending application Ser. No. 804,855 entitled Resonator and filed Dec. 5, 1985.

Figure 13:
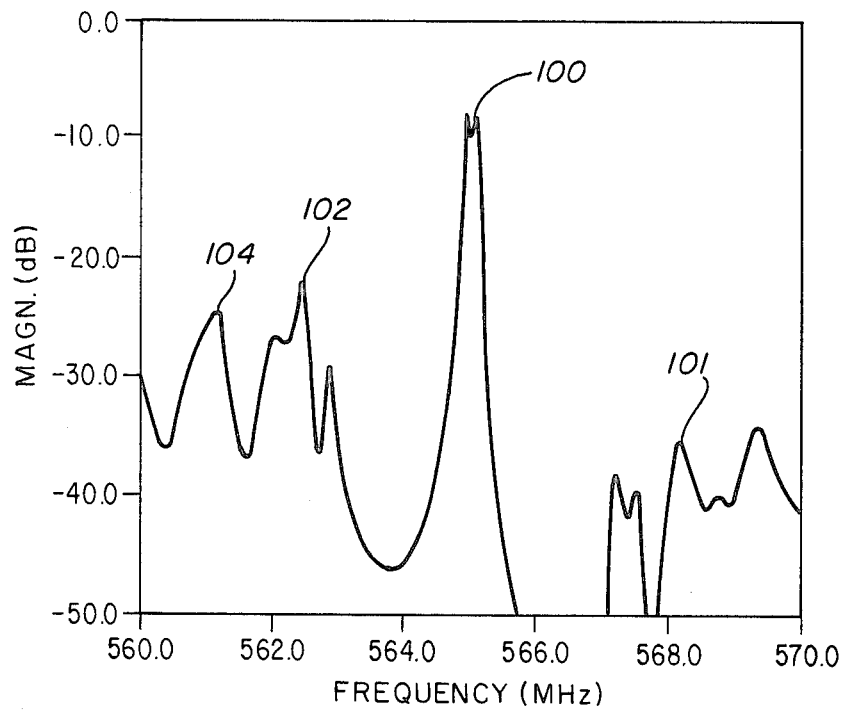
FIG. 13 is a typical frequency response of the prior art resonator filter of FIG. 1.

FIG. 13 illustrates a typical frequency response of the prior art resonator filter shown in FIG. 1 illustrating the high conductance peaks 102 and 104 on the low frequency side indicating that the filter is passing frequencies of substantial magnitude below the resonant peak indicated by peak 100.

Figure 14:
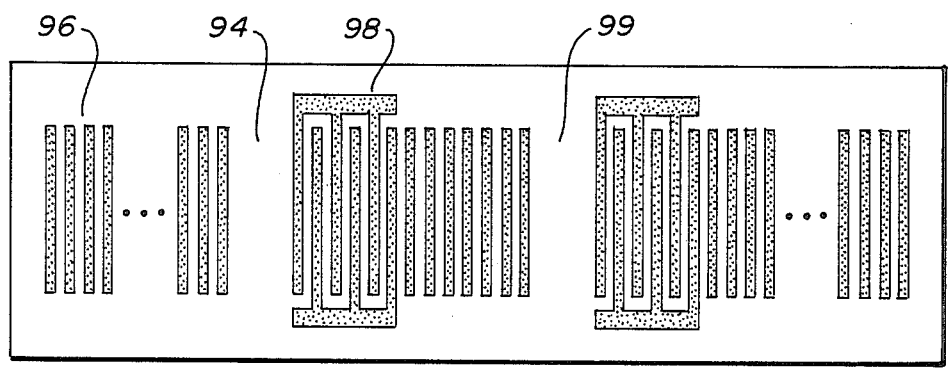
FIG. 14 illustrates the structure of the novel resonator filter of the present invention.

FIG. 14 illustrates the structure of the novel resonator filter of the present invention which utilizes the novel resonator structure shown in FIG. 5. As can be seen in FIG. 14, the only difference between the typical prior art resonator filter structure shown in FIG. 1 is the addition of cavity 94 between grating structure 96 and input transducer structure 98.

Figure 15:
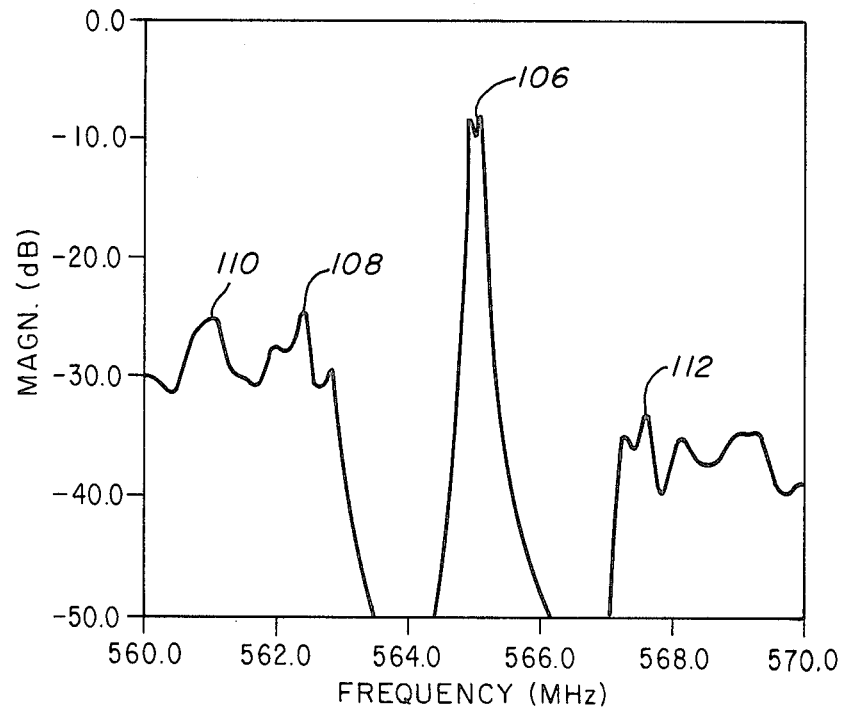
FIG. 15 illustrates the frequency response of the novel resonator filter as shown in FIG. 14 when the structure is placed on a standard crystal cut.

FIG. 15 is a representation of the frequency response of the novel resonator filter as shown in FIG. 14 when the structure is placed on a standard crystal cut. Note that low frequency peaks 108 and 110 have been suppressed by several dB without suppressing the main transmission peak 106 at resonance.

Figure 16:
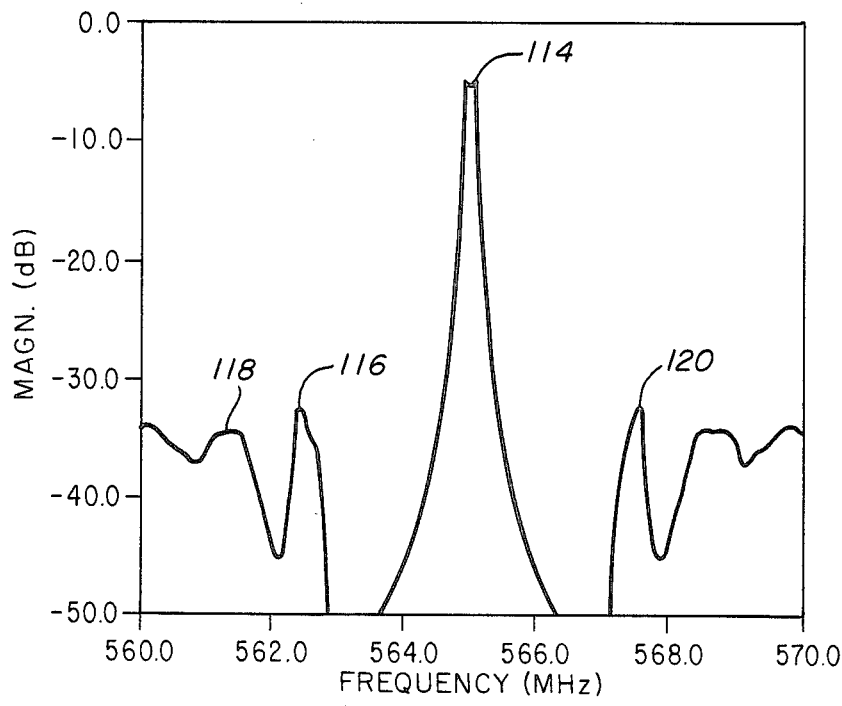
FIG. 16 is a representation of the frequency response of the novel resonator filter shown in FIG. 15 when it is placed on a natural SPUDT crystal cut.

FIG. 16 is a representation of the frequency response of the novel resonator filter shown in FIG. 14 when it is placed on a natural SPUDT crystal cut. The advantages are obvious in comparing the wave forms of FIG. 13 and 15 with the waveform in FIG. 16. Now it will be noted that main peak 114 shows greater conductance by several dB over peak 106 in FIG. 15 or peak 100 in FIG. 13. In addition, spurious low frequency side lobes 116 and 118 in FIG. 16 are suppressed by 8 to 10 dB over corresponding side lobes 108 and 110 in FIG. 15 and 9 to 11 dB over corresponding side lobes 102 and 104 in FIG. 13. Further, high frequency side lobe 120 is approximately the same as corresponding side lobes 101 in FIG. 13 and 112 in FIG. 15. Thus, extremely good performance is obtained from the novel resonator filter shown in FIG. 14 over the prior art filters whether the structure is placed on a standard crystal cut or a natural SPUDT crystal cut.

Thus, there has been disclosed a novel resonator structure which gives increased performance by placing the cavity that is resonant and normally between the input and output transducers between one of the transducers and its associated reflective grating. By placing this same structure on a natural SPUDT cut orientation crystal, a symmetrical output wave form is obtained which is extremely desirable and which is produced by a transducer that has no etched grooves or recessed electrodes, a minimum electrode geometry of $\lambda/4$, single level fabrication, uniform velocity throughout the structure and insensitivity to electrode reflections. By optimizing the coupling of each transducer to the resonant cavity by the addition or deletion of electrodes as needed, a maximized response or optimized response is obtained.

By utilizing this type of a structure in a resonator filter, improved response characteristics are obtained.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A resonator structure comprising:
   a. a piezoelectric substrate,
   b. first and second spaced gratings of $\lambda/4$ electrodes attached to said substrate,
   c. input and output spaced transducer structures having $\lambda/4$ electrodes and attached to said substrate between said first and second gratings for generating standing waves in said substrate, and
   d. an aperiodic cavity formed on said substrate between only one of said gratings and one of said transducers.

2. A resonator as in claim 1 wherein said gratings and said transducers are placed on said substrate such that said standing waves are maximally coupled to all transducer electrodes at resonance.

3. A resonator as in claim 2 wherein said cavity is formed only between said input transducer and its adjacent grating.

4. A resonator as in claim 3 further comprising a plurality of dummy electrodes attached to said substrate between said input and output transducers to create a substantially constant wave velocity between said transducers.

5. A resonator as in claim 1 further comprising:
   a. said input transducer having a first predetermined number of electrodes to obtain a predetermined coupling to said cavity, and
   b. said output transducer having a greater number of electrodes than said input transducer to increase its coupling to said cavity whereby the coupling of said input and output transducers to said resonant cavity may be balanced and the frequency response of said resonator improved.

6. A method of forming a resonator structure comprising the steps of:
   a. attaching first and second spaced gratings of $\lambda/4$ electrodes to a piezoelectric substrate,
   b. attaching input and output spaced transducer structures having $\lambda/4$ electrodes to said substrate between said first and second gratings for generating standing waves in said substrate, and
   c. forming an aperiodic cavity on said substrate between only one of said gratings and one of said transducers.

7. A method as in claim 6 further comprising the step of placing said gratings and said transducers said substrate such that said standing waves are maximally coupled to all transducer electrodes at resonance.

8. A method as in claim 7 further including the step of forming said cavity only between said input transducer and its adjacent grating.

9. A method as in claim 8 further comprising the step of attaching a plurality of dummy electrodes to said substrate between said input and output transducers to create a substantially constant wave velocity between said transducers.

10. A resonator filter structure comprising:
   a. a piezoelectric substrate,
   b. first and second spaced gratings of $\lambda/4$ electrodes attached to said substrate,
   c. input and output spaced transducers having $\lambda/4$ electrodes and attached to said substrate between said first and second gratings for generating standing waves in said substrate,
   d. a coupler grating positioned on said substrate between said input and output transducers,
   e. a first aperiodic cavity formed on said substrate between said input transducer and said first grating, and
   f. a second aperiodic cavity formed on said substrate between said coupler grating and said output transducer.

11. A resonator filter as in claim 10 wherein said gratings and said transducers are placed on said substrate such that said standing waves are maximally coupled to all transducer electrodes at resonance.

12. A method of forming a resonator filter structure comprising:
   a. attaching first and second spaced gratings of $\lambda/4$ electrodes to a piezoelectric substrate,
   b. attaching input and output spaced transducers having $\lambda/4$ electrodes to said substrate between said first and second gratings for generating standing waves in said substrate,
   c. positioning a coupler grating on said substrate between said input and output transducers,
   d. forming a first aperiodic cavity on said substrate between said input transducer and said first grating, and
   e. forming a second aperiodic cavity on said substrate between said coupler grating and said output transducer.

13. A method of forming a resonator filter as in claim 12 further including the step of placing said gratings and said transducers on said substrate such that said standing waves are maximally coupled to all transducer electrodes at resonance.

* * * * *